(12) United States Patent
Meng et al.

(10) Patent No.: US 12,324,152 B2
(45) Date of Patent: Jun. 3, 2025

(54) MEMORY CELLS WITH THREE-DIMENSIONAL GATE COUPLING AND METHODS OF FORMING THEREOF

(71) Applicant: GLOBALFOUNDRIES Singapore Pte. Ltd., Singapore (SG)

(72) Inventors: Wei Meng, Singapore (SG); Xin Qu, Singapore (SG); Laiqiang Luo, Singapore (SG); Fangxin Deng, Singapore (SG); Fan Zhang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 450 days.

(21) Appl. No.: 17/725,579

(22) Filed: Apr. 21, 2022

(65) Prior Publication Data

US 2023/0345718 A1    Oct. 26, 2023

(51) Int. Cl.
*H10B 41/60*    (2023.01)
*H10B 41/27*    (2023.01)

(52) U.S. Cl.
CPC .......... *H10B 41/60* (2023.02); *H10B 41/27* (2023.02)

(58) Field of Classification Search
CPC ........ H10B 41/60; H10B 41/27; H10B 41/30; H01L 29/40114; H01L 29/7885; H01L 29/42328
See application file for complete search history.

(56) References Cited

U.S. PATENT DOCUMENTS

| | | | |
|---|---|---|---|
| 5,242,848 A | 9/1993 | Yeh | |
| 6,103,573 A * | 8/2000 | Harari | H10B 41/30 438/257 |
| 6,133,097 A | 10/2000 | Hsieh et al. | |
| 6,566,707 B1 * | 5/2003 | Sudo | G11C 16/0458 257/327 |
| 6,747,310 B2 | 6/2004 | Fan et al. | |
| 2015/0372121 A1 * | 12/2015 | Chen | H01L 29/7883 438/593 |
| 2021/0036117 A1 * | 2/2021 | Yu | H01L 29/785 |

* cited by examiner

*Primary Examiner* — Julia Slutsker
(74) *Attorney, Agent, or Firm* — VIERING JENTSCHURA & PARTNER MBB

(57) ABSTRACT

A memory cell including a substrate having a first doped region and a second doped region spaced apart from each other and defining a channel region therebetween, a floating gate including a first end over the channel region and a second end over the first doped region, a control gate including a first portion arranged laterally adjacent to the second end of the floating gate and a second portion arranged over and overlapping the second end of the floating gate, a word line overlapping the channel region, the first end of the floating gate, and the second portion the control gate, a first insulation member separating the floating gate, the control gate and the word line from the substrate; a second insulation member separating the floating gate from the control gate, and a third insulation member separating the floating gate and the control gate from the word line.

20 Claims, 11 Drawing Sheets

|  | SL | | WL | | CG | | BL | | Time |
|---|---|---|---|---|---|---|---|---|---|
|  | Sel | Un-sel | Sel | Un-sel | Sel | Un-sel | Sel | Un-sel | |
| PGM | 6V | 0V | 1.5V | 0V | 8V | 0V | 1V | 2.5V | <10us |
| Erase | 0V | 0V | 8V | 0V | -8V | 0V | 0V | 0V | <10ms |
| Read | 0V | 0V | 2.5V | 0V | 0V | 0V | 0.9V | 0V | <30ns |

FIG. 7

MEMORY CELLS WITH THREE-DIMENSIONAL GATE COUPLING AND METHODS OF FORMING THEREOF

TECHNICAL FIELD

Various embodiments relate to memory cells, and more particular, to nonvolatile memory cells and methods of fabricating memory cells.

BACKGROUND

Flash memory is an electronic non-volatile computer storage medium that can be electrically erased and reprogrammed. Flash memory may include a plurality of flash memory cells. One type of flash memory cells is a split gate memory cell. Split gate memory cells have several advantages over other types of flash memory cells such as the stacked gate memory cells. These advantages include lower power consumption, higher injection efficiency, less susceptibility to short channel effects, and over erase immunity. The programming voltage and erase performance of split gate memory cells depend in part on the control gate (CG)-to-floating gate (GF) gate coupling ratio (GCR). However, it is challenging to manufacture a memory cell with a high CG-FG GCR as the manufacturing process may result in damage to the underlying semiconductor material.

SUMMARY

According to various embodiments, there may be provided a memory cell. The memory cell may include a substrate having a first doped region and a second doped region spaced apart from each other and defining a channel region therebetween; a floating gate over the substrate, the floating gate overlapping the first doped region and the channel region, the floating gate including a first end disposed over the channel region and a second end opposite the first end disposed over the first doped region; a control gate over the substrate, the control gate including a first portion arranged laterally adjacent to the second end of the floating gate and a second portion arranged over and overlapping the second end of the floating gate; a word line over the substrate, the word line arranged over and overlapping the channel region, the first end of the floating gate, and the second portion the control gate; a first insulation member on the substrate, the first insulation member separating the floating gate, the control gate and the word line from the substrate; a second insulation member on the floating gate, the second insulation member separating the floating gate from the control gate; and a third insulation member on the floating gate and the control gate, the third insulation member separating the floating gate and the control gate from the word line, wherein the substrate has a first conductivity type and the first and second doped regions have a second conductivity type opposite the first conductivity type.

According to various embodiments, the first insulation member overlaps the first doped region and the channel region, the second insulation member overlaps the second end of the floating gate and the first doped region, the second insulation member underlaps the control gate, and the third insulation member overlaps the first end of the floating gate and the control gate.

According to various embodiments, the floating gate partially overlaps the first doped region and partially overlaps the channel region.

According to various embodiments, the second portion of the control gate is wider than the first portion of the control gate.

According to various embodiments, the second end of the floating gate includes a side surface portion and a top surface portion, the side surface portion faces the first portion of the control gate and the top surface portion faces the second portion of the control gate.

According to various embodiments, the second portion of the control gate is disposed over and partially overlaps the channel region.

According to various embodiments, the control gate conformally covers the second end of the floating gate.

According to various embodiments, the second portion of the control gate overlaps more than half of the floating gate.

According to various embodiments, the control gate completely overlaps the first doped region.

According to various embodiments, the word line covers only a portion of the first end of the floating gate.

According to various embodiments, the word line conformally covers a corner of the first end of the floating gate.

According to various embodiments, the word line partially covers the control gate.

According to various embodiments, the word line conformally covers a corner of the second portion of the control gate.

According to various embodiments, the second insulation member conformally covers the second end of the floating gate.

According to various embodiments, the third insulation member conformally covers the first end of the floating gate and the control gate.

According to various embodiments, the floating gate, the control gate, and the word line include polysilicon.

According to various embodiments, the second insulation member includes oxide-nitride-oxide (ONO).

According to various embodiments, a portion of the third insulation member arranged along a side of the second portion of the control gate includes silicon nitride.

According to various embodiments, a side surface of the floating gate faces a side surface of the first portion of the control gate and an upper surface of the floating gate faces a lower surface of the second portion of the control gate.

According to various embodiments, there may be provided a method of forming a memory cell. The method may include providing a substrate having a first doped region and a second doped region spaced apart from each other and defining a channel region therebetween; providing a floating gate over the substrate, the floating gate overlapping the first doped region and the channel region, the floating gate including a first end disposed over the channel region and a second end opposite the first end disposed over the first doped region; providing a control gate over the substrate, the control gate including a first portion arranged laterally adjacent to the second end of the floating gate and a second portion arranged over and overlapping the second end of the floating gate; providing a word line over the substrate, the word line arranged over and overlapping the channel region, the first end of the floating gate, and the second portion the control gate; providing a first insulation member on the substrate, the first insulation member separating the floating gate, the control gate and the word line from the substrate; providing a second insulation member on the floating gate, the second insulation member separating the floating gate from the control gate; and providing a third insulation member on the floating gate and the control gate, the third insulation member separating the floating gate and the control gate from the word line, wherein the substrate has a first conductivity type and the first and second doped regions have a second conductivity type opposite the first conductivity type.

Additional features for advantageous embodiments are provided in the dependent claims.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 7 shows a table including example operative voltages of the memory cell according to various non-limiting embodiments.

DESCRIPTION

Figure 1:
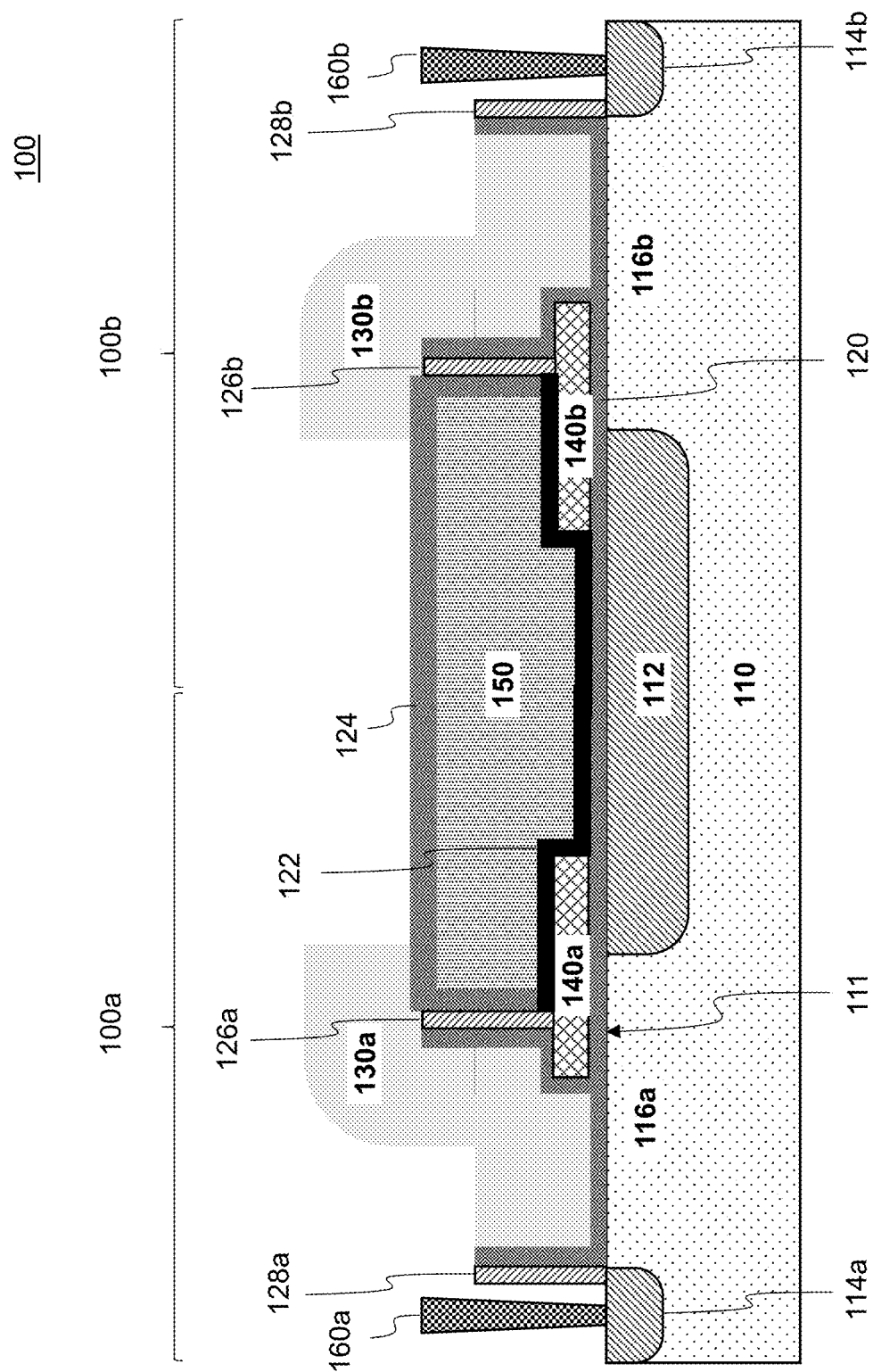
FIG. 1 shows a simplified cross-sectional view of a memory cell according to various non-limiting embodiments.

Aspects of the present invention and certain features, advantages, and details thereof, are explained more fully below with reference to the non-limiting examples illustrated in the accompanying drawings. Descriptions of suitable materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while considering that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

The embodiments generally relate to memory cells. More particularly, some embodiments relate to flash memory devices, and split-gate non-volatile memory cells.

FIG. 1 shows a simplified cross-sectional view of a memory cell 100 according to various non-limiting embodiments.

Referring to FIG. 1, the memory cell 100 includes a first memory unit 100a and a second memory unit 100b. As shown in FIG. 1, the first memory unit 100a may include a substrate 110 including a plurality of doped regions. The plurality of doped regions includes a first doped region 112 and a second doped region 114a. The first doped region 112 and the second doped region 114a may be spaced apart from each other, and may define a channel region 116a between them. The substrate 110 may have an upper surface 111. The first doped region 112 and the second doped region 114a may be provided along the upper surface 111 of the substrate 110. The first doped region 112 may serve as a select line (SL) for the first memory unit 100a. The second doped region 114a may serve as a contact for a bit line (BL) for the first memory unit 100a.

The substrate 110 may be formed from a semiconductor. The substrate 110, for example, may be a silicon substrate. The substrate 110 may also be a silicon germanium, germanium, gallium arsenide, or crystal-on-insulator (COI) such as silicon-on-insulator (SOI) substrate. The substrate 110 may be an undoped substrate. In some embodiments, for example, the substrate 110 may be lightly doped with p-type dopants. In some embodiments, the substrate 110 may be provided with other types of dopants or dopant concentrations.

The substrate 110 may have a first conductivity type. The first doped region 112 and the second doped region 114a may have a second conductivity type that is different from the first conductivity type. The first conductivity type and the second conductivity type may be opposite conductivity types. For example, the second conductivity type may be p-type while the first conductivity type may be n-type, or vice-versa. The first doped region 112 and the second doped region 114a may be formed in the substrate 110 by implanting those regions of the substrate 110 with dopants of the second conductivity type.

The first memory unit 100a may further include an insulation member 120 disposed on the surface 111 of the substrate 110. The insulation member 120 may cover the first doped region 112 and the channel region 116a. The insulation member 120 may not cover the second doped region 114a. The insulation member 120 may extend continuously from the first doped region 112 towards the second doped region 114a. The insulation member 120 may include a dielectric material such as silicon oxide. Other examples of dielectric materials may include, for example, oxides, nitrides, or oxynitrides. The dielectric materials may be high-k dielectric materials, such as, aluminum oxide, hafnium oxide, silicon nitride, silicon oxynitride, or combinations thereof.

The first memory unit 100a may further include a word line (WL) 130a, a floating gate (FG) 140a and a control gate (CG) 150 disposed over the insulation member 120. The word line 130a, the floating gate 140a, and the control gate 150 may be separated from each other by one or more insulation members. The floating gate 140a may be arranged over and overlapping a portion of the first doped region 112 and a portion of the channel region 116a. The control gate 150 may be arranged over and overlapping the first doped region 112, a portion of the floating gate 140a and a portion of the channel region 116a. The word line 130a may be arranged over the channel region 116a, a portion of the floating gate 140a and a portion of the control gate 150. The word line 130a, the floating gate 140a and the control gate 150 may be formed from polysilicon, or other semiconductor materials.

Figure 2:
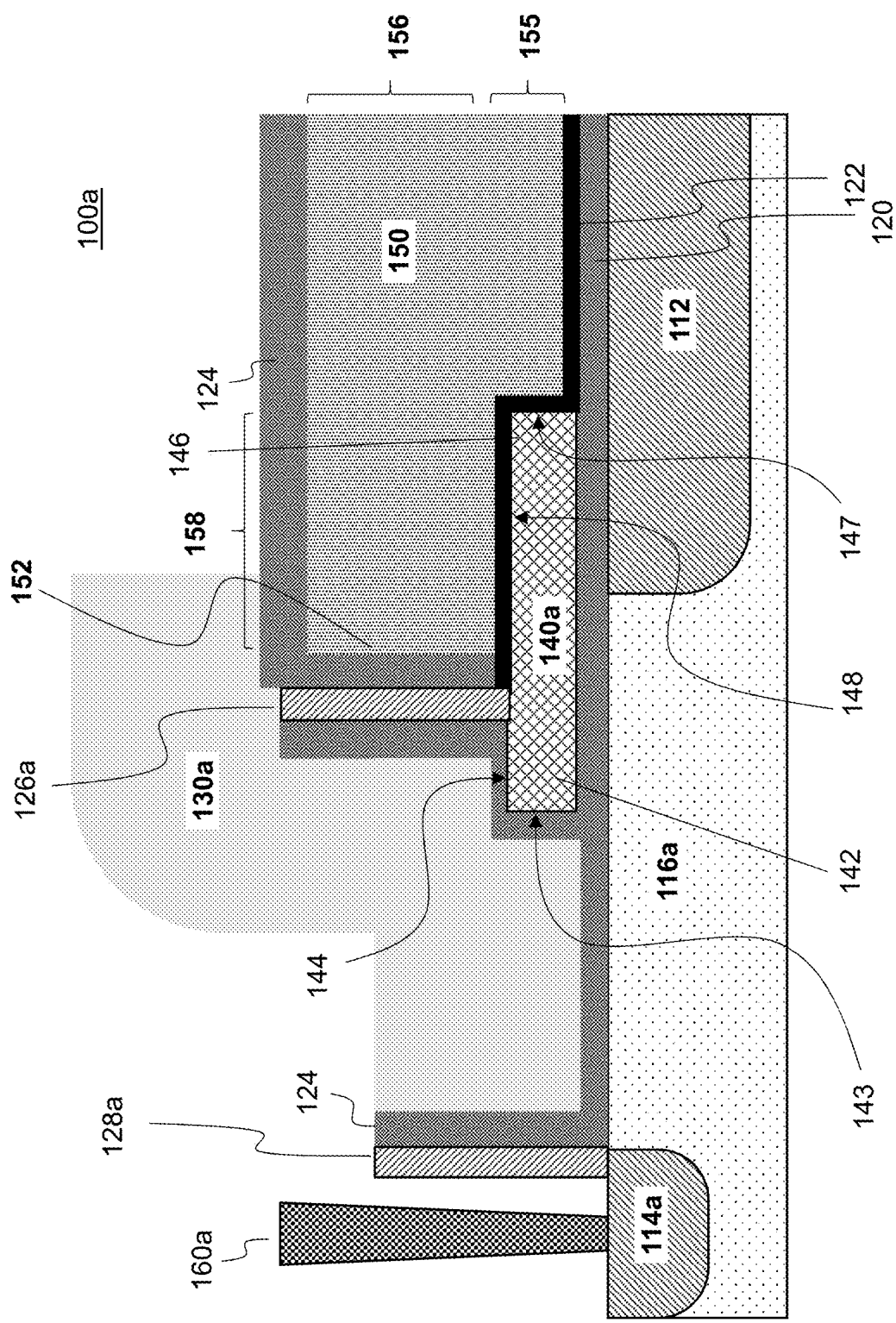
FIG. 2 shows magnified cross-sectional view of the memory cell of FIG. 1 according to various non-limiting embodiments.

FIG. 2 shows a magnified cross-sectional view of the memory cell 100 according to various non-limiting embodiments.

Referring to FIG. 2, the floating gate 140a may further be arranged between the word line 130a and the control gate 150. The floating gate 140a may include a first end 142 and a second end 146, the second end 146 opposite the first end 142. The first end 142 may be nearer to the word line 130a and the second end 146 may be nearer to the control gate 150. The first end 142 may be arranged over and overlapping the channel region 116a and the second end 146 may be arranged over and overlapping the first doped region 112.

The first end 142 may further be covered by a portion of the word line 130a. That is, the first end 142 may include a side portion 143 and a top portion 144 that are covered by the word line 130a. The word line 130a may conformally cover the first end 142 of the floating gate 140a. The second end 146 may be covered by a portion of the control gate 150. That is, the second end 146 may include a side portion 147 and a top portion 148 that are covered by the control gate 150. The control gate 150 may conformally cover the second end 146 of the floating gate 140a.

The control gate 150 may include a lower portion 155 and an upper portion 156. The upper portion 156 may be wider than the lower portion 155 such that the upper portion 155 protrudes from the lower portion. The upper portion 156 may protrude from the lower portion 155 so as to partially overlap the floating gate 140a. The upper portion 156 may include an overhang portion 158 that overlaps the floating gate. Referring to FIG. 2, the lower portion 155 of the control gate 150 may be disposed adjacent to the second end 146 of the floating gate 140a. For example, the lower portion 155 may have a thickness that is substantially similar to a thickness of the floating gate 140a.

The upper portion 156 of the control gate 150 may further be arranged over the floating gate 140a to extend along the top portion 148 of the floating gate 140a. The upper portion 156 may include the overhang portion 158 that is disposed over and overlaps the second end 146 of the floating gate 140a. The overhang portion 158 may overlap the entire portion of the floating gate 140a that is disposed over and overlapping the first doped region 112. The overhang portion 158 of the control gate 150 may further be arranged over the floating gate 140a to overlap a portion of the floating gate 140a that is disposed over the channel region 116a.

The portion of the channel region 116a underlapping the floating gate 140a may be adjacent to the first doped region 112.

Referring to FIG. 2, the word line 130a may be arranged over the floating gate 140a to extend along the top portion 144 of the floating gate 140a. The word line 130a may overlap the first end 142 of the floating gate 140a. The word line 130a may overlap a substantial or the entire portion of the floating gate 140a that is disposed over the channel region 116a. In various embodiments, the word line 130a may further be arranged over the floating gate 140a and control gate 150 to partially overlap the overhang portion 158 of the control gate 150 that is disposed over the channel region 116a. In various embodiments, the word line 130a may further be disposed over a portion of the first doped region 112.

In various embodiments, at least half of the floating gate 140a may be disposed over the first doped region 112. In various embodiments, the control gate 150 may be disposed over more than at least half of the floating gate 140a.

The word line 130a, floating gate 140a, control gate 150 and substrate 110 may be separated from each other by one or more insulation members, including insulation member 120. The insulation member 120 may insulate the floating gate 140a from the second doped region 114a and the channel region 116a. The insulation member 120 may further insulate the floating gate 140a from the channel region 116a and the first doped region 112. The insulation member 120 may further insulate the control gate 150 from the first doped region 112. The insulation member 120 may be made from insulator material including one of silicon oxide, silicon nitride, silicon oxide stack or combinations thereof.

The first memory unit 100a may further include a second insulation member 122 disposed over the floating gate 140a and the insulation member 120. The second insulation member 122 may insulate the floating gate 140a from the control gate 150. For example, the second insulation member 122 may be arranged to overlap and cover the second end 146 of the floating gate 140a. The second insulation member 122 may conformally cover a side portion 147 and a top portion 148 of the floating gate 140a. The second insulation member 122 may be a multilayer dielectric. For example, the second insulation member 122 may include an oxide-nitride-oxide (ONO).

The first memory unit 100a may further include a third insulation member 124 disposed over and overlapping the floating gate 140a, the control gate 150 and a portion of the insulation member 120. The third insulation member 124 insulates the control gate 150 and the floating gate 140a from the word line 130a. For example, the third insulation member 124 may be arranged to cover the first end 142 of the floating gate 140a. The third insulation member 124 may cover a side portion 143 and a top portion 144 of the floating gate 140a. For example, the third insulation member 124 may be arranged to further conformally cover the control gate 150. That is, part of the third insulation member 124 may insulate the floating gate 140a from the word line 130a. Another part of the third insulation member 124 may insulate the word line 130a from the control gate 150. A further part of the third insulation member 124 may insulate the word line 130a from the second doped region 114a.

The third insulation member 124 may include a dielectric material such as silicon oxide. At least a portion of the third insulation member 124 may be a multilayer dielectric. For example, the portion of the third insulation member 124 separating the word line 130a from the side portion 152 of the control gate 150 may further include a silicon nitride layer 126a extending vertically along the side portion 152 between two silicon oxide layers. For another example, the portion of the third insulation member 124 separating the word line 130a from the second doped region 114a may further include a silicon nitride layer 128a adjacent to the silicon oxide layer both extending vertically along a side portion of the word line 130a.

In various embodiments, the insulation members may include dielectric materials, for example oxides, nitrides, or oxynitrides. The dielectric materials may be high-k dielectric materials such as aluminum oxide, hafnium oxide, silicon nitride, silicon oxynitride, or combinations thereof. In various embodiments, the word line 130a, the floating gate 140a and the control gate 150 may be formed from polysilicon, or other semiconductor materials.

Referring to FIG. 2 which shows a magnified view of the first memory unit 100a, the floating gate 140a may have a tip formed at the corner of the first end 142 where the side portion 143 and the top portion 144 meet. In various embodiments, the side portion 143 and top portion 144 may meet at a substantially perpendicular angle. In other various embodiments, the side portion 143 may incline towards the top portion 144. The word line 140a may conformally cover the first end 142 of the floating gate 140a.

Referring to FIG. 2, the second doped region 114a may include an interconnect for a contact terminal (CT) 160a disposed over the second doped region 114a. The interconnect 160a may include a metal. The interconnect may be in direct contact with the second doped region 114a. The interconnect 160a may be separated from the word line 130a by a portion of the third insulation member 124. The interconnect 160a may further be separated from the word line 130a by a further insulation member 128a. The further insulation member 128a may include silicon nitride. The second doped region 114a may be electrically coupled to a bit line.

The second memory unit 100b of memory cell 100 is substantially a mirrored version of the first memory unit 100a. The first doped region 112 (e.g., select line) and control gate 150 are common to the first memory unit 100a and the second memory unit 100b.

Figure 3:
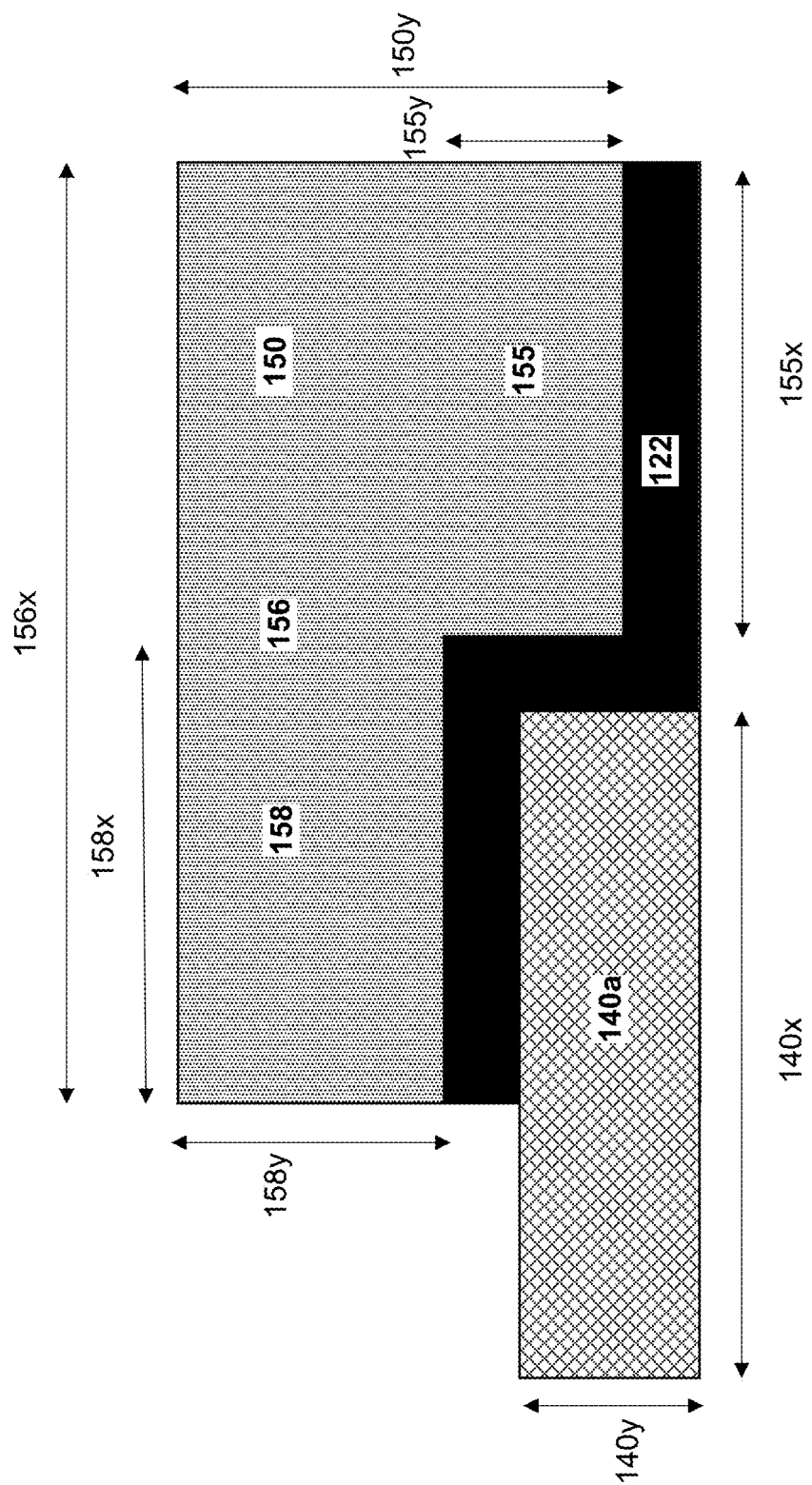
FIG. 3 shows a further simplified and magnified cross-sectional view of the memory cell of FIG. 1 according to various non-limiting embodiments.

FIG. 3 shows a further magnified and simplified view of the first memory unit 100a according to various non-limiting embodiments. For example, referring to FIG. 3, the control gate 150 may include a lower portion 155 having a length 155x and a height 155y and an upper portion 156 having a length 156x and a height 158y. The upper portion 156 may be wider than the lower portion 155 such that the upper portion 155 protrudes from the lower portion. The upper portion 156 may protrude from the lower portion 155 so as to partially overlap the floating gate 140a. The upper portion 156 that overlaps the floating gate 106 may be referred herein as the overhang portion 158 of the control gate 150. The overhang portion 156 may have a length 158x.

For example, referring to FIG. 3, the height 140y of the floating gate and the height 155y of the lower portion 155 of the control gate 150 may be substantially the same. The length 140x of the floating gate may be greater than the length 158x of the overhang portion 158 of the control gate 150. The length 155x of the lower portion 155 of the control gate 150 may be greater than the length 158x of the overhang portion 158 of the control gate 150. The height 158y of the overhang portion 158 and upper portion 156 of the control gate 150 may be greater than the height 155y of the lower portion 155 of the control gate 150.

Figure 6:
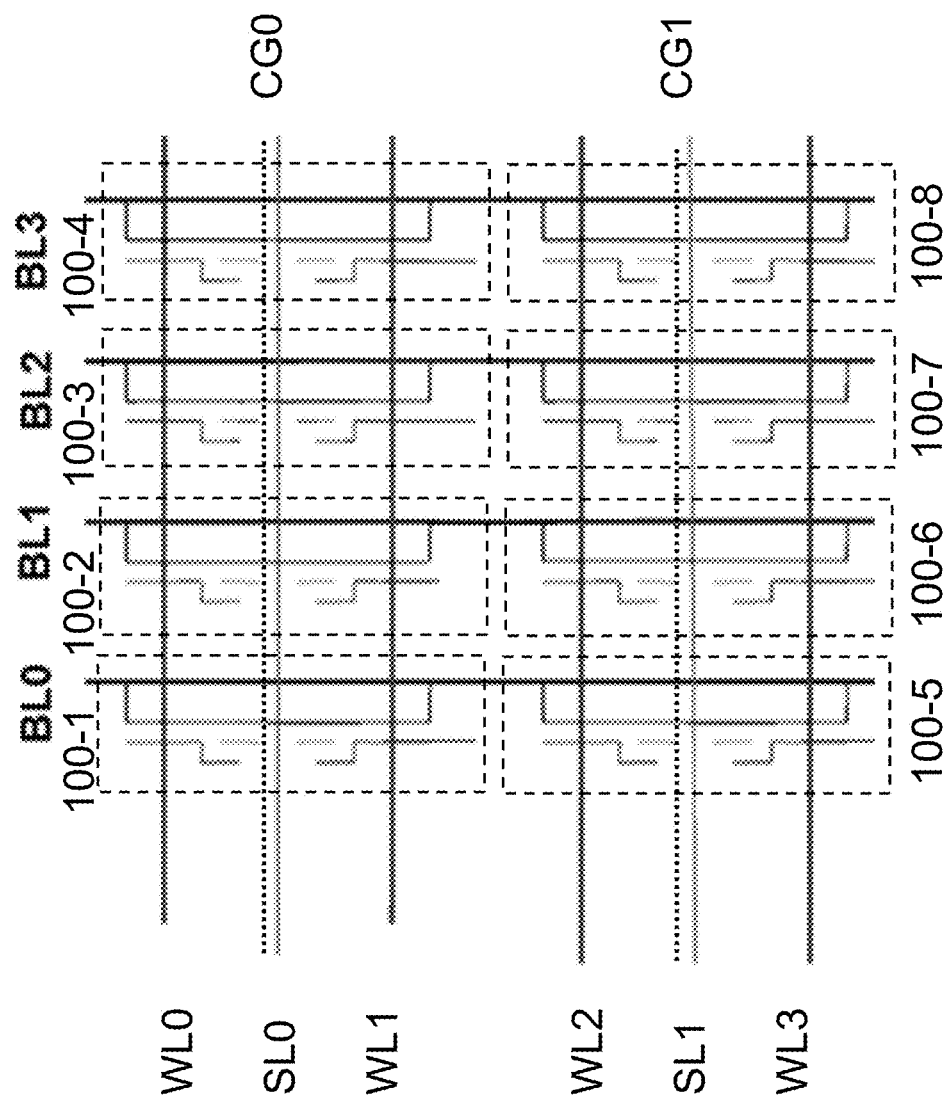
FIG. 6 shows a simplified array arrangement of memory cells of FIG. 1 according to various non-limiting embodiments.

FIG. 6 shows a simplified logical schematic illustrating the connections for an array of memory cells 100. Each of the dashed boxes includes a memory cell 100. For example, with respect to memory cell 100-1, the first doped region 112 may be connected to SL0, the control gate 150 may be connected to CG0, the second doped region 114a may be connected to BL0, the second doped region 114b may be connected to BL0, the word line 130a may be connected to WL0, the word line 130b may be connected to WL1. For example, with respect to memory cell 100-2, the first doped region 112 may be connected to SL0, the control gate 150 may be connected to CG0, the second doped region 114a may be connected to BL1, the second doped region 114b may be connected to BL1 the word line 130a may be connected to WL0, the word line 130b may be connected to WL1. And connections are similarly made with regards to memory cells 100-3 and 100-4. For example, with respect to memory cell 100-5, the first doped region 112 may be connected to SL1, the control gate 150 may be connected to CG1, the second doped region 114a may be connected to BL0, the second doped region 114b may be connected to BL0, the word line 130a may be connected to WL2, the word line 130b may be connected to WL3. For example, with respect to memory cell 100-6, the first doped region 112 may be connected to SL1, the control gate 150 may be connected to CG1, the second doped region 114a may be connected to BL1, the second doped region 114b may be connected to BL1, the word line 130a may be connected to WL2, the word line 130b may be connected to WL3. And connections are similarly made with regards to memory cells 100-7 and 100-8.

Figure 4:
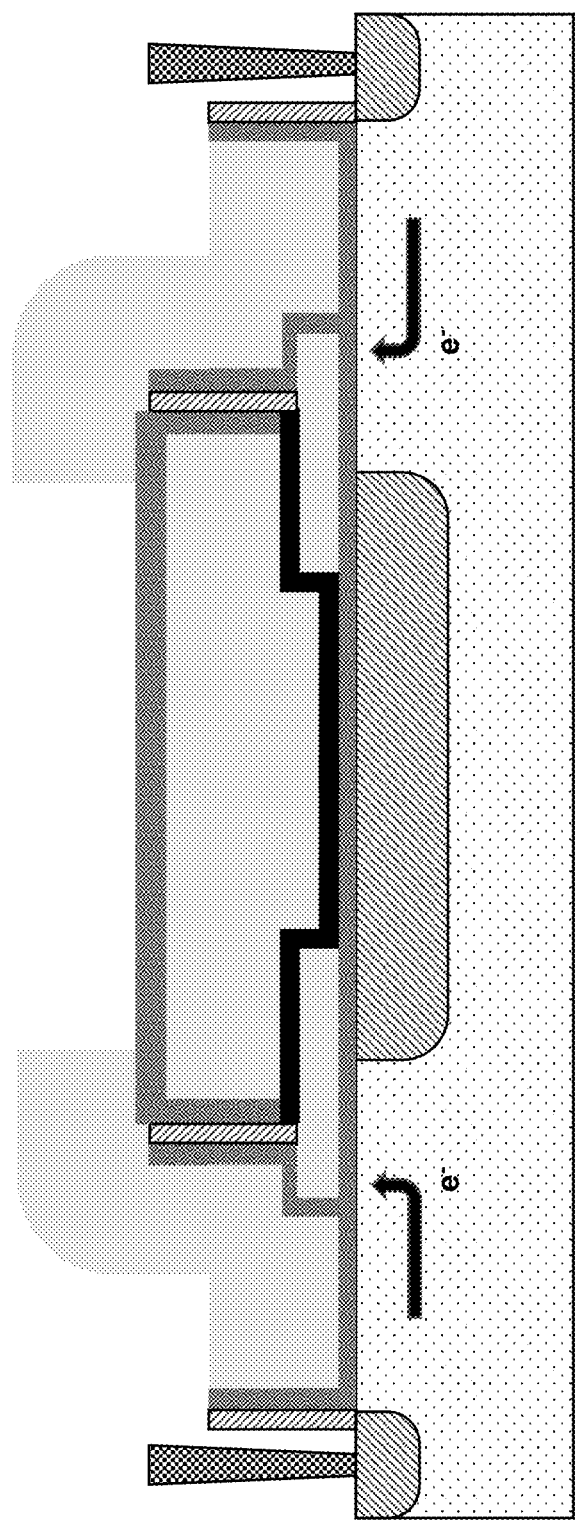
FIG. 4 shows an operative cross-sectional view of the memory cell of FIG. 1 during a programming phase according to various non-limiting embodiments.

FIG. 4 shows an operative cross-sectional view of the memory cell of FIG. 1 during a programming phase according to various non-limiting embodiments.

Figure 5:
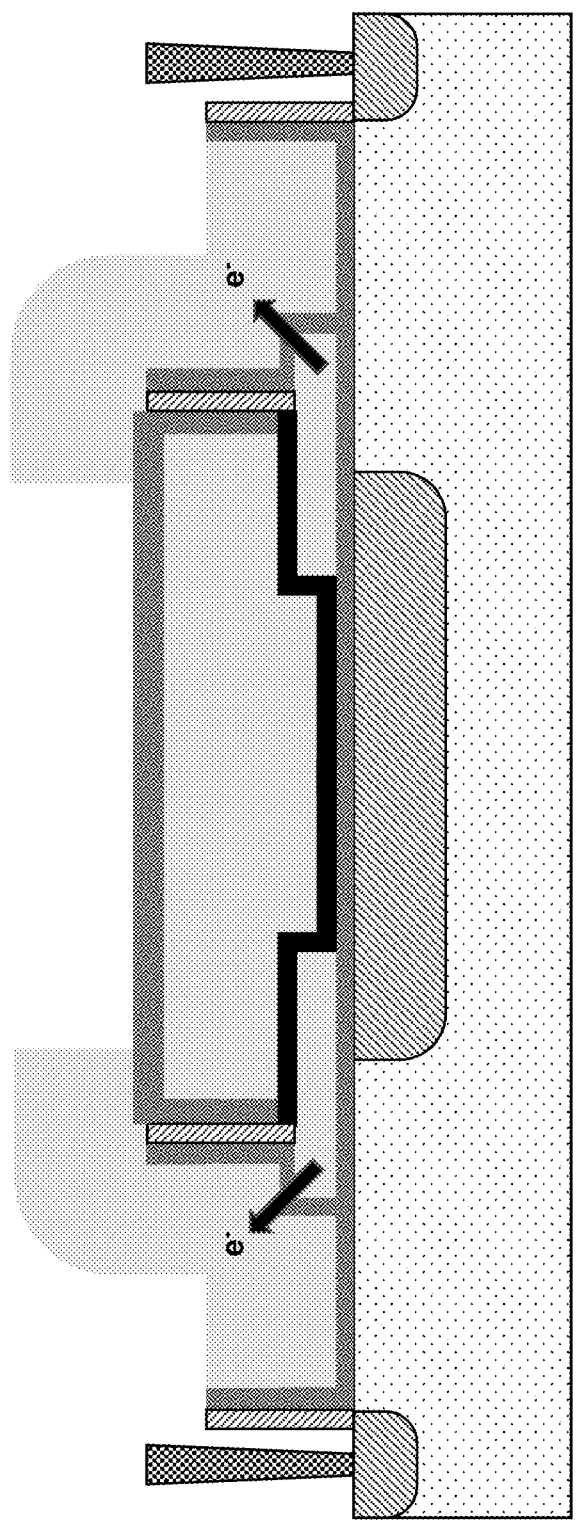
FIG. 5 shows an operative cross-sectional view of the memory cell of FIG. 1 during an erasing phase according to various non-limiting embodiments.

FIG. 5 shows an operative cross-sectional view of the memory cell of FIG. 1 during an erasing phase according to various non-limiting embodiments.

FIG. 6 shows a simplified array arrangement of memory cells of FIG. 1 according to various non-limiting embodiments.

FIG. 7 shows a table including example operative voltages of the memory cell according to various non-limiting embodiments.

Referring to FIGS. 4 and 7, the memory cell unit 100a is in programming mode when the first doped region 112 (SL) is at 6V, the word line 130a (WL) is at 1.5 V, the control gate (CG) 150 is at 8V, and the second doped region 114a (BL) is at 2.5V. During the programming mode, there is a voltage differential between the control gate 150 and the bit line 114a via the floating gate 140a, the voltage of the control gate turns the floating gate 140a conductive, and the floating gate 140a stores electrons received from the channel 116a. The floating gate 140a is set to the same voltage as the control gate.

Referring to FIGS. 5 and 7, the memory cell unit 100a is in erase mode when the first doped region 112 (SL) is at 0 V, the word line 130a (WL) is at 8 V, the control gate (CG) 150 is at −8V, and the second doped region 114a (BL) is at 0 V. During the erase mode, there is a voltage differential between the control gate 150 and the word line 130a via the floating gate 140a, the voltage of the control gate turns the floating gate 140a conductive, and the stored electrons in the floating gate 140a is discharged through the word line 130a. The floating gate 140a is set to 2.5V, the same voltage as the word line 130a.

Figure 8:
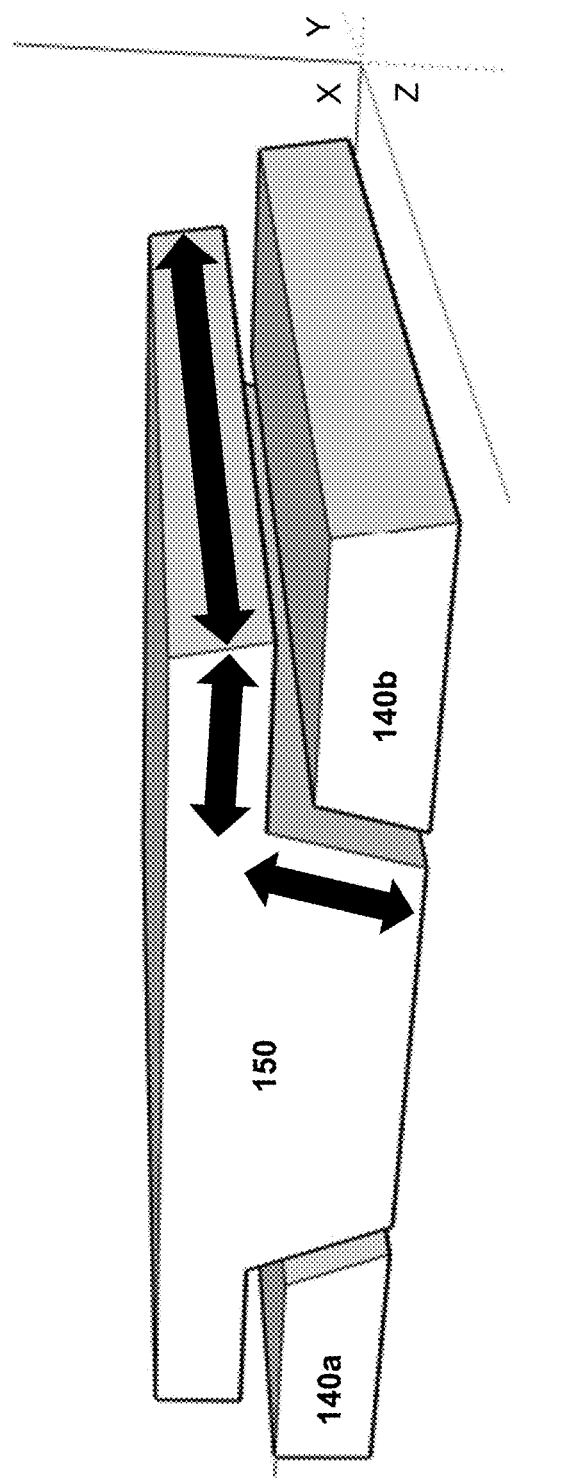
FIG. 8 shows a simplified three dimensional perspective view of a memory cell according to various non-limiting embodiments.

FIG. 8 shows a simplified 3D perspective view of a memory cell according to various non-limiting embodiments. FIG. 8 shows only the control gate 150 and the floating gate 140a and 140b and their relationship to each other. As shown in FIG. 8, the control gate 150 is adjacent to and/or overlaps the floating gate 140a in the X-direction, Y-direction, and Z-direction (three-dimensions). That is, two surfaces of the control gate are opposite two surfaces of the floating gate. The improved CG to FG GCR (gate coupling ratio) facilitates a lower programming voltage of 8V instead of 11.5V in a conventional memory cell unit, thus enhancing PGM efficiency. The higher GCR (gate coupling ratio) is facilitated by maximizing CG/SL overlap with FG. The erase performance may also be enhanced by minimizing WL to FG overlap and applying negative voltage on CG.

FIGS. 9A to 9E show simplified cross-sectional views illustrating a method for fabricating the memory cell 100 according to various non-limiting embodiments. For clarity of illustration, some reference numerals are omitted from FIGS. 9A to 9E.

Figure 9A:
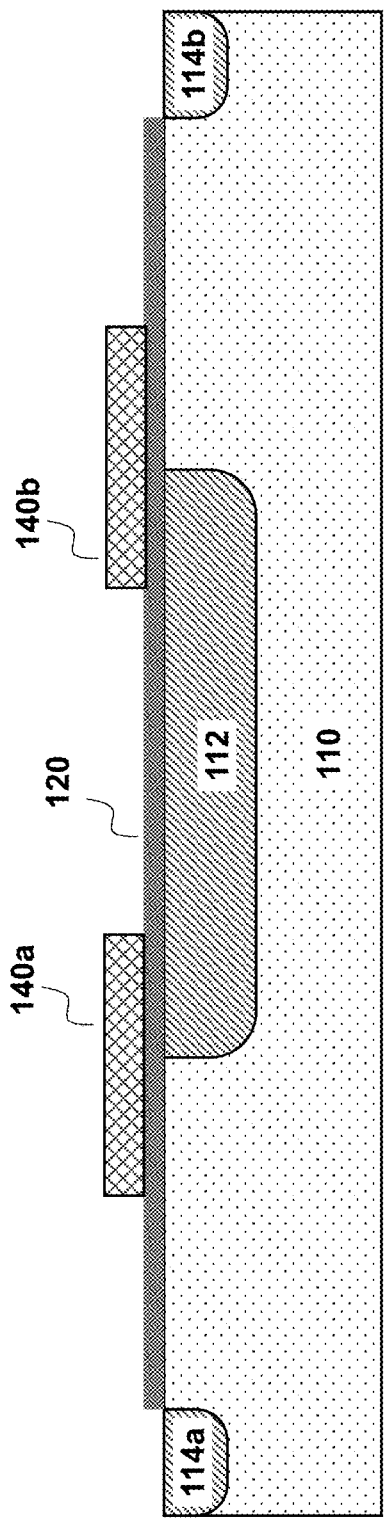
FIGS. 9A to 9E show simplified cross-sectional views illustrating a method for fabricating a memory cell according to various non-limiting embodiments.

Referring to FIG. 9A, a first doped region 112 and two second doped regions 114a and 114b may be formed in the substrate 110 using suitable implanting techniques. For example, a 5V deep Nwell, a HV Nwell, and a HV Pwell may be provided. A deep Nwell may allow negative voltage usage. Further, an NVM pwell and SL implant may be provided. An insulation member 120 may then be formed over the substrate 110 using suitable techniques, e.g., silicon oxide deposition via CVD. For example, the insulation member 120 may be formed on the upper surface 111 of the substrate 110. Two floating gates 140a and 140b may be formed over and on the insulation member 120 so that each floating gate overlaps an end portion of the first doped region 112. The floating gates 140a and 140b may be spaced apart from each other such that there is a gap therebetween. The floating gates may be formed using suitable techniques, e.g., floating gate mask patterning, polysilicon implanting and annealing.

Figure 9B:
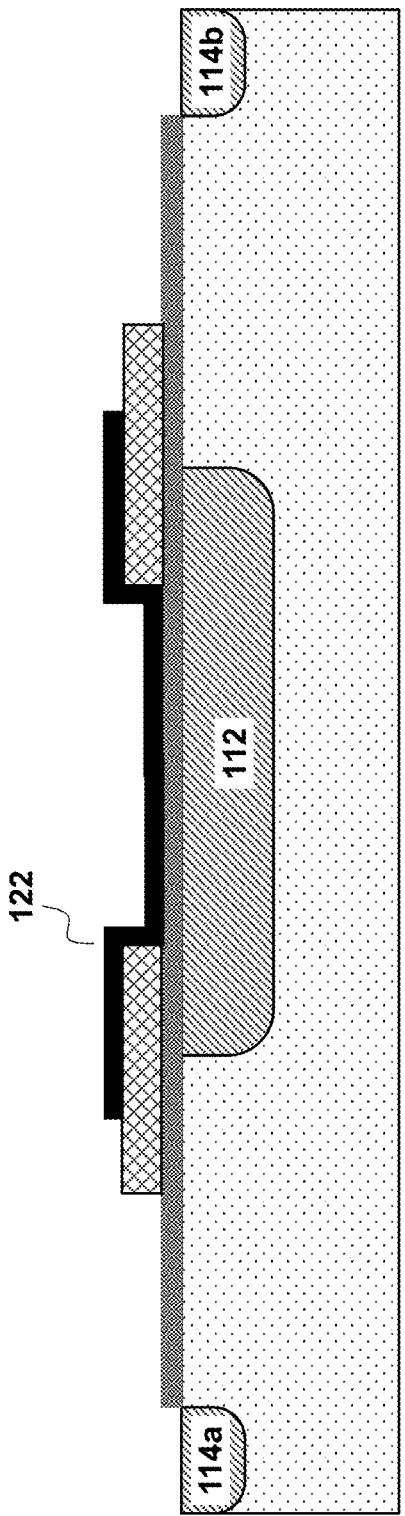

Referring to FIG. 9B, a second insulation member 122 may be provided over each floating gate 140a and 140b and the space therebetween. The second insulation member 122 may continuously extend from floating gate 140a to floating gate 140b. The second insulation member 122 may include an insulating material such as one of silicon dioxide, silicon nitride, or combination thereof. The second insulation member 122 may conformally cover and overlap an end of each of the floating gates 140a and 140b. The insulation member 122 may be formed using suitable techniques, e.g., ONO deposit and ONO anneal.

Figure 9C:
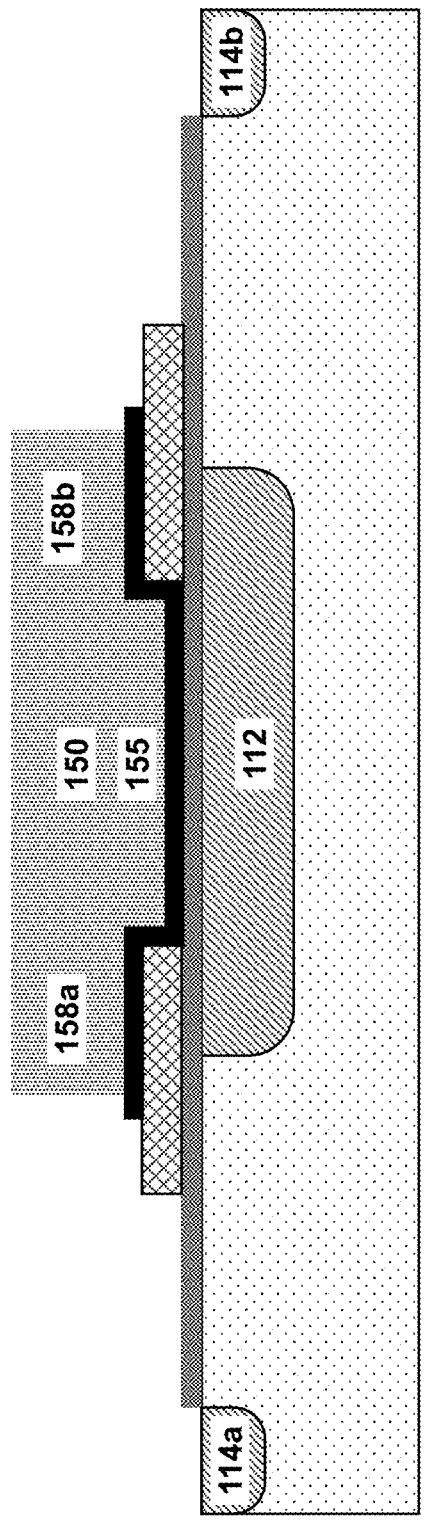

Referring to FIG. 9C, a control gate 150 may be formed over the insulation member 122 so that the control gate 150 may overlap the floating gates. A lower portion 155 of the control gate 150 is disposed between the floating gates 140a and 140b and an upper portion 156 of the control gate 150 includes overhang portions 158a, 158b that overlap an end of each of the floating gates 140a, 140b, respectively. Each floating gate 140a and 140b may be insulated from the control gate 150 by the second insulation member 122. The control gate 150 may be formed using suitable techniques, e.g., control gate mask patterning, polysilicon implanting and annealing.

Figure 9D:
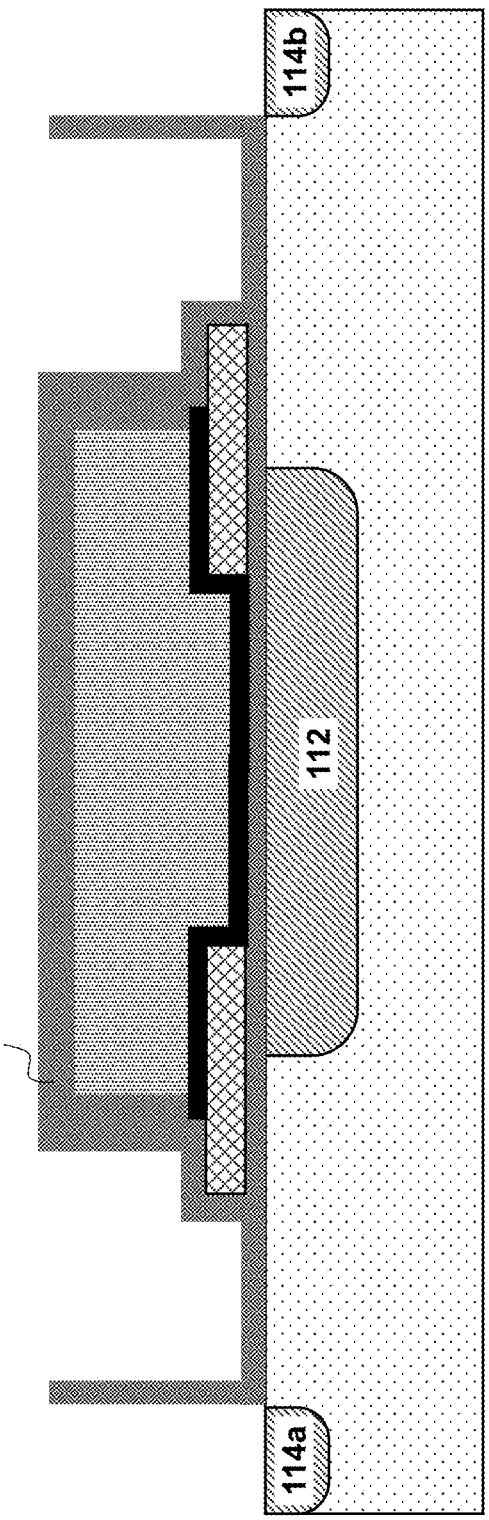

Referring to FIG. 9D, a third insulation member 124 may be formed over the floating gates 140a, 140b and the control gate 150 using suitable techniques. The process may include depositing an insulating material, such as an oxide onto the floating gates and the control gate and growing the insulation material through an oxidation process. A portion of the third insulation member 124 may further include a silicon nitride layer 126a, 126b extending vertically along a side portion 152 of the control gate 150. The silicon nitride layer may be formed between two silicon oxide layers. A second portion of the third insulation member 124 may also further include a silicon nitride layer 128a, 128b extending vertically from the second doped region 114 and along a bit line contact terminal 160. The multilayer portions of the third insulation member 124 may be formed using suitable techniques.

Figure 9E:
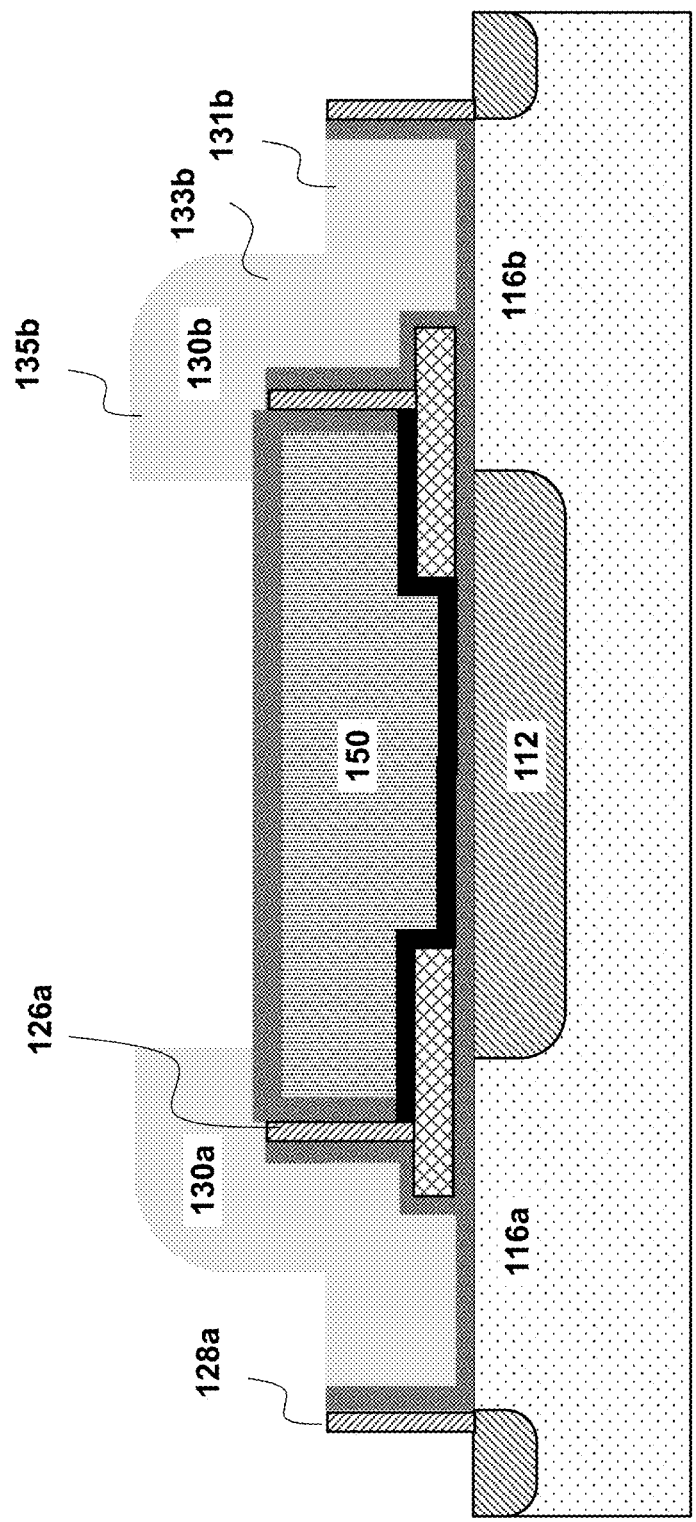

Referring to FIG. 9E, word lines 130a and 130b may be formed on the third insulation member 124 covering the floating gates 140a, 140b and control gate 150 to form the memory cell 100. The word lines may be formed using suitable techniques, e.g., word line mask, polysilicon implant and annealing. Each word line 130 may be continuous and include a first horizontal segment 131, a vertical segment 133, and a second horizontal segment 135. Each word line 130a, 130b may conformally cover and overlap a portion of a channel region 116a, 116b, an end 142 of a floating gate 140a, 140b, and an end of a control gate 150. The first horizontal segment 131 may cover a portion of the channel region. The vertical segment 133 may cover side portion 143 and top portion 144 at an end 142 of the floating gate 140 and a side portion 152 of the control gate 150. The second horizontal segment 135 may cover a top portion at an end of the control gate 150.

A logic device (not shown) may also be fabricated onto the semiconductor structure.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory cell comprising:
a substrate having a first doped region and a second doped region spaced apart from each other and defining a channel region therebetween;
a floating gate over the substrate, the floating gate overlapping the first doped region and the channel region, the floating gate including a first end disposed over the channel region and a second end opposite the first end disposed over the first doped region;
a control gate over the substrate, the control gate including a first portion arranged laterally adjacent to the second end of the floating gate and a second portion arranged over and overlapping the second end of the floating gate;
a word line over the substrate, a first end of the word line arranged over and overlapping the channel region and not overlapping the second doped region, a second end of the word line arranged over and overlapping the first end of the floating gate and the second portion the control gate;
a first insulation member on the substrate, the first insulation member separating the floating gate, the control gate and the word line from the substrate;
a second insulation member on the floating gate, the second insulation member separating the floating gate from the control gate; and
a third insulation member on the substrate, the floating gate and the control gate, a first portion of the third insulation member separating the floating gate and the control gate from the word line and a second portion of the third insulation member separating the word line from the second doped region,
wherein the substrate has a first conductivity type and the first and second doped regions have a second conductivity type opposite the first conductivity type.

2. The memory cell of claim 1, wherein
the first insulation member overlaps the first doped region and the channel region,
the second insulation member overlaps the second end of the floating gate and the first doped region, the second insulation member underlaps the control gate, and
the third insulation member overlaps the first end of the floating gate and the control gate.

3. The memory cell of claim 2, wherein the floating gate partially overlaps the first doped region and partially overlaps the channel region.

4. The memory cell of claim 2, the second portion of the control gate is wider than the first portion of the control gate.

5. The memory cell of claim 4, wherein the second end of the floating gate includes a side surface portion and a top surface portion, the side surface portion faces the first portion of the control gate and the top surface portion faces the second portion of the control gate.

6. The memory cell of claim 4, wherein the second portion of the control gate is disposed over and partially overlaps the channel region.

7. The memory cell of claim 2, wherein the control gate conformally covers the second end of the floating gate.

8. The memory cell of claim 2, wherein the second portion of the control gate overlaps more than half of the floating gate.

9. The memory cell of claim 2, wherein the control gate completely overlaps the first doped region.

10. The memory cell of claim 2, wherein the word line covers only a portion of the first end of the floating gate.

11. The memory cell of claim 10, wherein the word line conformally covers a corner of the first end of the floating gate.

12. The memory cell of claim 10, wherein the word line partially covers the control gate, and the word line conformally covers a corner of the second portion of the control gate.

13. The memory cell of claim 2, wherein the second insulation member conformally covers the second end of the floating gate.

14. The memory cell of claim 2, wherein the floating gate, the control gate, and the word line include polysilicon.

15. The memory cell of claim 2, wherein the second insulation member includes oxide-nitride-oxide (ONO).

16. The memory cell of claim 2, wherein a side surface of the floating gate faces a side surface of the first portion of the control gate and an upper surface of the floating gate faces a lower surface of the second portion of the control gate.

17. A method of manufacturing a memory cell comprising:
providing a substrate having a first doped region and a second doped region spaced apart from each other and defining a channel region therebetween;
providing a floating gate over the substrate, the floating gate overlapping the first doped region and the channel region, the floating gate including a first end disposed over the channel region and a second end opposite the first end disposed over the first doped region;
providing a control gate over the substrate, the control gate including a first portion arranged laterally adjacent to the second end of the floating gate and a second portion arranged over and overlapping the second end of the floating gate;
providing a word line over the substrate, a first end of the word line arranged over and overlapping the channel region and not overlapping the second doped region, a second end of the word line arranged over and overlapping the first end of the floating gate, and the second portion the control gate;
providing a first insulation member on the substrate, the first insulation member separating the floating gate, the control gate and the word line from the substrate;
providing a second insulation member on the floating gate, the second insulation member separating the floating gate from the control gate; and
providing a third insulation member on the substrate, the floating gate and the control gate, a first portion of the third insulation member separating the floating gate and the control gate from the word line and a second portion of the third insulation member separating the word line from the second doped region,
wherein the substrate has a first conductivity type and the first and second doped regions have a second conductivity type opposite the first conductivity type.

18. The memory cell of claim 1, wherein the first portion of the third insulation member separating the floating gate and the control gate from the word line includes a first silicon nitride layer, the first silicon nitride layer disposed in a vertical direction along a side portion of the control gate.

19. The memory cell of claim 1, wherein the portion of the third insulation member separating the word line from the second doped region includes a second silicon nitride layer, the second silicon nitride layer disposed in a vertical direction along a side portion of the word line such that the word line does not overlap the second doped region.

20. The memory cell of claim 1, wherein the second doped region includes an interconnect for a contact terminal disposed over the second doped region.

\* \* \* \* \*